(12) United States Patent
Redeker et al.

(10) Patent No.: US 7,604,011 B2
(45) Date of Patent: Oct. 20, 2009

(54) METHOD AND APPARATUS FOR SEMICONDUCTOR WAFER CLEANING USING HIGH-FREQUENCY ACOUSTIC ENERGY WITH SUPERCRITICAL FLUID

(75) Inventors: Fred C. Redeker, Fremont, CA (US); John M. Boyd, Hillsboro, OR (US); John Parks, Hercules, CA (US)

(73) Assignee: Lam Research Corporation, Fremont, CA (US)

( * ) Notice: Subject to any disclaimer, the term of this patent is extended or adjusted under 35 U.S.C. 154(b) by 108 days.

(21) Appl. No.: 11/670,631

(22) Filed: Feb. 2, 2007

(65) Prior Publication Data

US 2007/0119477 A1    May 31, 2007

Related U.S. Application Data

(62) Division of application No. 10/357,664, filed on Feb. 3, 2003, now Pat. No. 7,191,787.

(51) Int. Cl.
*B08B 3/12* (2006.01)
*B08B 7/02* (2006.01)

(52) U.S. Cl. .......................... 134/1.3; 134/2
(58) Field of Classification Search ............ 134/1, 134/1.3, 2, 56 R, 58 R, 105, 184, 195, 200, 134/902
See application file for complete search history.

(56) References Cited

U.S. PATENT DOCUMENTS

| | | | | |
|---|---|---|---|---|
| 4,398,116 | A * | 8/1983 | Lewis | 310/334 |
| 4,909,266 | A * | 3/1990 | Massa | 134/60 |
| 5,316,591 | A * | 5/1994 | Chao et al. | 134/34 |
| 5,870,351 | A * | 2/1999 | Ladabaum et al. | 367/163 |
| 6,333,268 | B1 * | 12/2001 | Starov et al. | 438/691 |
| 6,602,349 | B2 * | 8/2003 | Chandra et al. | 134/19 |
| 6,875,284 | B2 * | 4/2005 | Scranton | 134/1 |

* cited by examiner

*Primary Examiner*—Alexander Markoff
*Assistant Examiner*—Nicole Blan
(74) *Attorney, Agent, or Firm*—Martine Penilla & Gencarella, LLP

(57) ABSTRACT

An apparatus and a method is provided for using high-frequency acoustic energy with a supercritical fluid to perform a semiconductor wafer ("wafer") cleaning process. High-frequency acoustic energy is applied to the supercritical fluid to impart energy to particulate contamination present on the wafer surface. Energy imparted to particulate contamination via the high-frequency acoustic energy and supercritical fluid is used to dislodge and remove the particulate contamination from the wafer. Additionally, the wafer cleaning process benefits from the supercritical fluid properties of near zero surface tension, high diffusivity, high density, and chemical mixing capability.

20 Claims, 9 Drawing Sheets

METHOD AND APPARATUS FOR SEMICONDUCTOR WAFER CLEANING USING HIGH-FREQUENCY ACOUSTIC ENERGY WITH SUPERCRITICAL FLUID

CLAIM OF PRIORITY

This is a divisional application (under 35 U.S.C. 120) of U.S. patent application Ser. No. 10/357,664, filed on Feb. 3, 2003 now U.S. Pat. No. 7,191,787. The disclosure of the above-identified application is incorporated herein by reference.

BACKGROUND OF THE INVENTION

1. Field of the Invention

The present invention relates generally to semiconductor wafer cleaning. More specifically, the present invention relates to a method and apparatus for using high-frequency acoustic energy with supercritical fluid to perform a semiconductor wafer cleaning operation.

2. Description of the Related Art

In the manufacture of semiconductor devices, a surface of a semiconductor wafer ("wafer" or "substrate") must be cleaned to remove chemical and particulate contamination. If the contamination is not removed, semiconductor devices on the wafer may perform poorly or become defective. Particulate contamination generally consists of tiny bits of distinctly defined material having an affinity to adhere to the surface of the wafer. Examples of particulate contamination can include organic and inorganic residues, such as silicon dust, silica, slurry residue, polymeric residue, metal flakes, atmospheric dust, plastic particles, and silicate particles, among others.

Traditionally, wet-cleaning of a wafer has been performed using conventional solvents composed of aqueous, semi-aqueous, or organic solvent chemistries. In general, the conventional solvents can be applied to the wafer in the form of a bath or rinse. Some wafer cleaning processes also incorporate mechanical assistance from scrubbing brushes or high-pressure sprays. Also, most wet-cleaning processes are followed by a deionized water rinse and subsequent wafer drying process. Depending on the solvent used, the properties of both the solvents and the rinses used in the wet-cleaning process have a surface tension property with a wetting angle that is a function of the surface characteristics of the substrate. The surface may be hydrophilic, hydrophobic, or have properties somewhere in-between hydrophobic or hydrophilic. In cases where the surface is hydrophilic, a solution with a low wetting angle will easily wet the surface, and the fluid will be drawn into high-aspect ratio features by capillary forces. These capillary forces must be overcome to remove the liquid from the features after cleaning. Therefore, the high surface tension causes the liquid solutions to collect and adhere within structures present on the wafer surface, thus presenting difficulty during the drying process.

FIG. 1A is an illustration showing the collection and adherence of an aqueous or semi-aqueous solution 105 between high aspect ratio wafer structures 103 present on the surface of a wafer 101 following a wet-cleaning process, in accordance with the prior art. High surface tension causes the aqueous solution 105 to resist removal from between the structures 103 during the drying process. Since the aqueous or semi-aqueous solution 105 tends to be retained between the structures 103, removal of the solution 105 can cause the collapse of very small structures due to the capillary forces. Hence, there is a potential for the structures 103 to be damaged. This phenomenon is a well known issue in the cleaning and drying of MEMs structures, especially in MR heads.

FIG. 1B is an illustration showing distortion damage of the structures 103 caused by capillary force collapse during the drying process, in accordance with the prior art. As the aqueous or semi-aqueous solution 105 is removed by a high speed spin, evaporation, or other means, the high aspect ratio wafer structures 103 can be forced together as indicated by arrow 107 due to the surface tension caused by the capillary forces present. The distortion of the structures 103 can adversely affect subsequent wafer processing and ultimate device performance.

FIG. 1C is an illustration showing delamination damage of the structures 103 caused by capillary force collapse during the drying process, in accordance with the prior art. Again, as the solution 105 is removed from the high aspect ratio features, the capillary forces can cause collapse of the high aspect ratio wafer structures 103 to the point of delamination from an underlying substrate material as indicated by arrows 109. The propensity of the wafer structures 103 to delaminate is a function of the bond strength between the structures 103 and the underlying substrate material. Delamination damage of the structures 103 will certainly cause subsequent wafer processing and ultimate device performance to be adversely affected.

Aqueous or semi-aqueous solutions used for conventional solvents and rinses can also introduce difficulty through absorption into wafer surface materials. For example, aqueous solutions can be absorbed into a porous matrix, such as that of a porous low-K material. Driving off absorbed aqueous solution from the porous matrix of the low-K material during the drying process can cause physical damage or changes to the low-K material structure or enhance diffusion of contaminants through the low-K material. Physical damage, changes, and contamination of the low-K material can degrade its performance. However, allowing the absorbed aqueous or semi-aqueous solution to remain in the porous matrix of the low-K material can lower the dielectric constant of the low-K material and adversely impact device performance. Due to the difficulty associated with the aqueous or semi-aqueous nature of conventional solvents and rinses, it is desirable to develop an alternative approach for performing the wafer cleaning and rinsing process.

FIG. 2 is an illustration showing a generalized material phase diagram, in accordance with the prior art. The phase of the material is represented as regions of solid, liquid, and gas, wherein the presence of a particular phase is dependent on pressure and temperature. The gas-liquid phase boundary follows an increase in both pressure and temperature up to a point called the critical point. The critical point is delineated by a critical pressure ($P_c$) and a critical temperature ($T_c$). At pressures and temperatures beyond $P_c$ and $T_c$, the material becomes a supercritical fluid.

The supercritical fluid shares the properties of both a gas phase and a liquid phase. The supercritical fluid has near zero surface tension. Therefore, the supercritical fluid can reach into and between small features on the wafer surface without causing the problems associated with the high surface tension of an aqueous or semi-aqueous solution. Also, the supercritical fluid has a diffusivity property similar to a gas. Therefore, the supercritical fluid can get into porous regions of wafer materials, such as low-K dielectric material, without becoming trapped. Additionally, the supercritical fluid has a density similar to a liquid. Therefore, more supercritical fluid can be transported to the wafer in a given amount of time as compared to a gas.

One prior art approach to using supercritical fluid in a wafer cleaning process is to fill a chamber with supercritical fluid and allow a wafer to soak in the supercritical fluid. However, simply filling the chamber with supercritical fluid and allowing the wafer to soak is not sufficient to remove strongly adhering particulate contamination. Furthermore, adding a solvent to the supercritical fluid and allowing the wafer to soak may dissolve some contaminants but is not sufficient to dislodge strongly adhering particulate contamination. Therefore, even with supercritical fluid it is necessary to apply sufficient energy to the particle/wafer interface to dislodge the particulate contamination.

A prior art approach for applying energy in the form of shear force to the particle/wafer interface involves repeatedly filling and flushing the chamber with supercritical fluid. The flow of supercritical fluid over the wafer surface during the flush is intended to impart sufficient shear force to the particle/wafer interface to dislodge the particulate contamination. As particles decrease in size, the linear velocity of the supercritical fluid required to dislodge the particles increases. For example, a supercritical fluid linear velocity of about 100 cm/sec is required to dislodge a particle having a size of about 0.1 micron. Unfortunately, using the fill and flush approach to obtain sufficient supercritical fluid linear velocities at the particle/wafer interface to dislodge smaller particles is difficult, if not impossible. One reason for this is that it is not reasonable to design and operate a chamber which relies on the flushing to impart the necessary linear velocity to the supercritical fluid to cause particulate contamination to be dislodged from the wafer surface. To cause the supercritical fluid to flow at the required velocity during the flush operation, a sufficient pressure drop must exist across the chamber. However, both a pressure greater than $P_c$ and a temperature greater than $T_c$ must be maintained within each region of the chamber during the flush operation to preserve the supercritical phase of the supercritical fluid. Additionally, for the larger particulate contamination which may be removed with the fill and flush approach, multiple fill and flush cycles are required to adequately remove the particulate contamination. Use of multiple fill and flush cycles is time-consuming and not suitable for single-wafer process cycle times.

In view of the foregoing, there is a need for an apparatus and a method for effectively and efficiently using supercritical fluid to remove particulate contamination from a wafer surface. The apparatus and method should avoid the problems associated with relying on high supercritical fluid linear velocities to remove small particulate contamination. The apparatus and method should also avoid the use of extended single-wafer process cycle times.

SUMMARY OF THE INVENTION

Broadly speaking, the present invention fills these needs by providing an apparatus and a method for using high-frequency acoustic energy with a supercritical fluid to perform a semiconductor wafer ("wafer" or "substrate") cleaning process. More specifically, the present invention applies high-frequency acoustic energy to the supercritical fluid to impart energy to particulate contamination present on the wafer surface. Energy imparted to particulate contamination via the high-frequency acoustic energy and supercritical fluid is used to overcome intermolecular forces acting to adhere the particulate contamination to the wafer. Additionally, the wafer cleaning process afforded by the present invention is enhanced by the beneficial properties of the supercritical fluid. It should be appreciated that the present invention can be implemented in numerous ways, including as a process, an apparatus, a system, a device, or a method. Several embodiments of the present invention are described below.

In one embodiment, an apparatus for cleaning a wafer is provided. The apparatus includes a volume configured to contain a supercritical fluid. Within the volume, the supercritical fluid is in contact with a wafer. Additionally, a number of transducers are in communication with the volume. The number of transducers are capable of applying acoustic energy to the supercritical fluid contained within the volume. The acoustic energy applied to the supercritical fluid is capable of imparting energy to particulate contamination present on the wafer surface. The energy imparted to the particulate contamination present on the wafer surface causes the particulate contamination to be dislodged from the wafer surface, thus cleaning the wafer.

In another embodiment, another apparatus for cleaning a wafer is provided. The apparatus includes a chamber having an internal volume. The chamber is configured to maintain a supercritical fluid within the internal volume. The apparatus also includes one or more transducers disposed in communication with the internal volume. The transducers are capable of applying acoustic energy to the supercritical fluid to be maintained within the internal volume of the chamber. When a wafer is present in the chamber internal volume, the acoustic energy applied to the supercritical fluid is capable of imparting energy to particulate contamination present on the wafer surface. The energy imparted to the particulate contamination present on the wafer surface causes the particulate contamination to be dislodged from the wafer surface, thus cleaning the wafer.

In another embodiment, a method for cleaning a wafer is provided. The method includes exposing a wafer to a supercritical fluid and applying acoustic energy to the supercritical fluid. The acoustic energy applied to the supercritical fluid is capable of imparting energy to particulate contamination present on the wafer. The energy imparted to the particulate contamination present on the wafer causes the particulate contamination to be removed from the wafer, thus cleaning the wafer.

In another embodiment, another method is disclosed for cleaning a wafer. The method includes disposing a wafer between a first plurality of transducers and a second plurality of transducers. The first plurality of transducers includes transducers of different shape. The second plurality of transducers mirrors the first plurality of transducers with regard to a shape of each transducer. The method also includes exposing the wafer to a supercritical fluid. The method further includes operating the first and second plurality of transducers to generate and transfer acoustic energy through the supercritical fluid to the wafer.

In another embodiment, another method is disclosed for cleaning a wafer. The method includes disposing a wafer between a first plurality of transducers and a second plurality of transducers. The second plurality of transducers mirrors the first plurality of transducers with regard to a geometric configuration of each transducer. The method also includes exposing the wafer to a supercritical fluid. The method further includes activating a pair of mirrored transducers so as to generate and transfer acoustic energy through the supercritical fluid to the wafer in a direction extending between the pair of mirrored transducers. The pair of mirrored transducers is defined by one transducer in the first plurality of transducers and one transducer in the second plurality of transducers.

In another embodiment, another method is disclosed for cleaning a wafer. The method includes disposing a wafer between a first plurality of transducers and a second plurality of transducers. Each of the first plurality of transducers is mirrored by a transducer in the second plurality of transducers to form a mirrored pair of transducers. The method also includes exposing the wafer to a supercritical fluid. The method further includes cyclically activating each mirrored pair of transducers so as to transfer acoustic energy through the supercritical fluid to different areas the wafer. Each of the different areas of the wafer corresponds to activation of a different mirrored pair of transducers.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for an apparatus and a method for using high-frequency acoustic energy with a supercritical fluid to perform a semiconductor wafer ("wafer" or "substrate") cleaning process. The present invention applies high-frequency acoustic energy to the supercritical fluid to impart energy to particulate contamination present on the wafer surface. Energy imparted to particulate contamination via the high-frequency acoustic energy and supercritical fluid is used to overcome intermolecular forces acting to adhere the particulate contamination to the wafer. Additionally, the wafer cleaning process afforded by the present invention benefits from the supercritical fluid properties of near zero surface tension, high diffusivity, high density, and chemical mixing capability.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
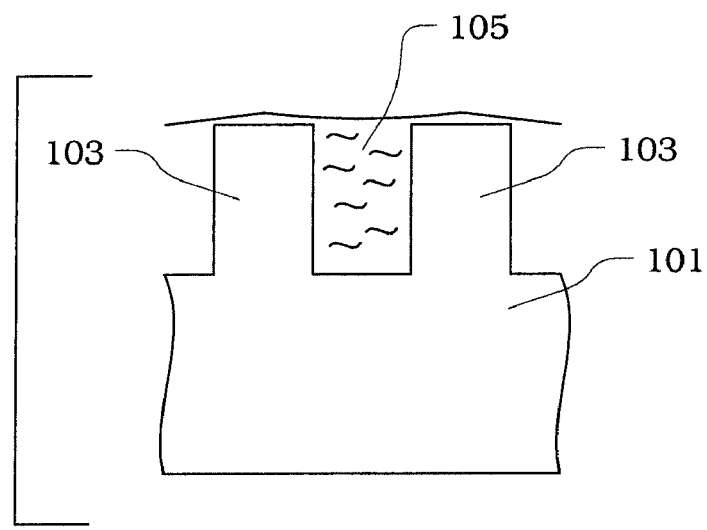
FIG. 1A is an illustration showing the collection and adherence of an aqueous or semi-aqueous solution between high aspect ratio wafer structures present on the surface of a wafer following a wet-cleaning process, in accordance with the prior art.
Figure 1B:
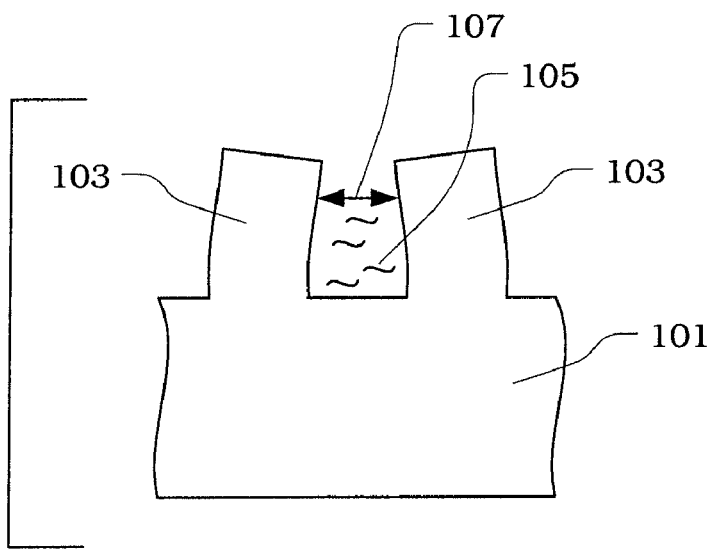
FIG. 1B is an illustration showing distortion damage of the structures caused by capillary force collapse during the drying process, in accordance with the prior art.
Figure 1C:
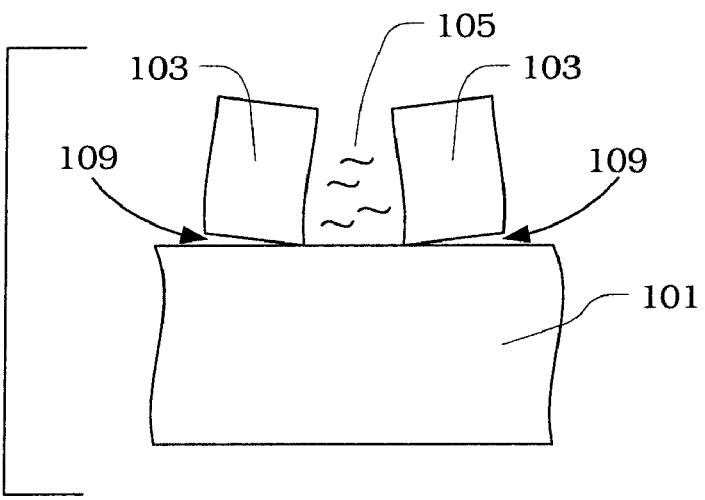
FIG. 1C is an illustration showing delamination damage of the structures caused by capillary force collapse during the drying process, in accordance with the prior art.
Figure 2:
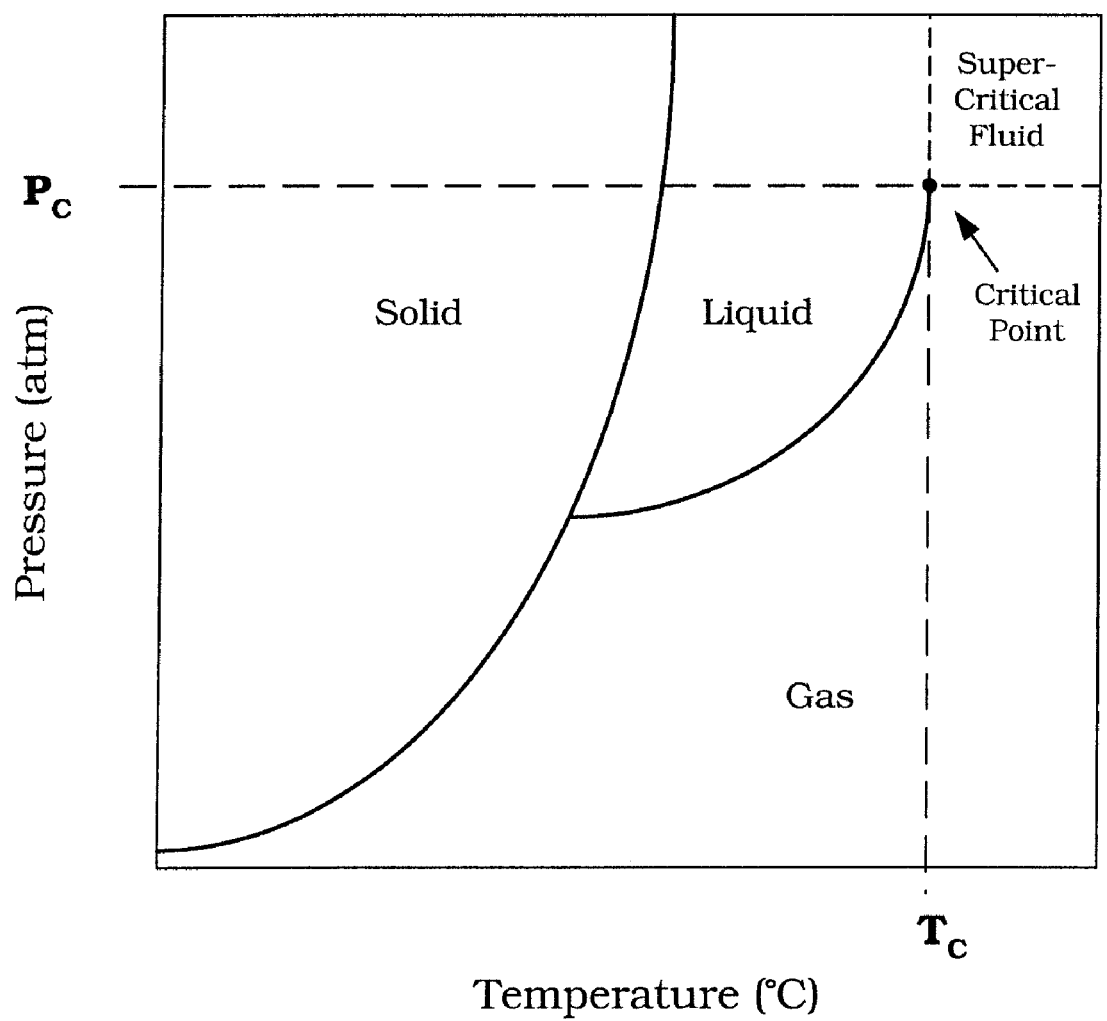
FIG. 2 is an illustration showing a generalized material phase diagram, in accordance with the prior art.
Figure 3A:
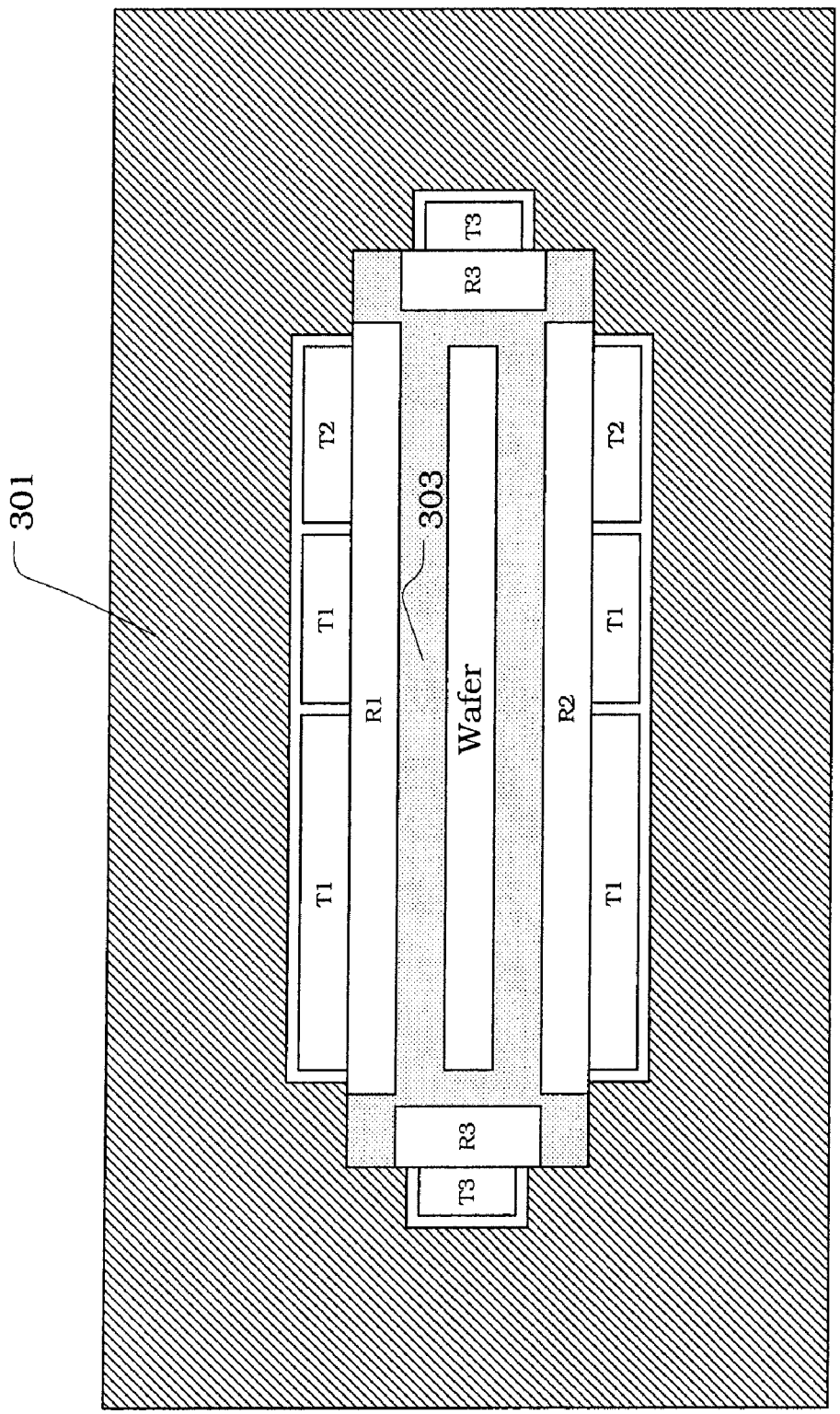
FIGS. 3A-3C are illustrations showing a chamber for performing a wafer cleaning operation using high-frequency acoustic energy applied to a supercritical fluid, in accordance with one embodiment of the present invention.
Figure 3B:
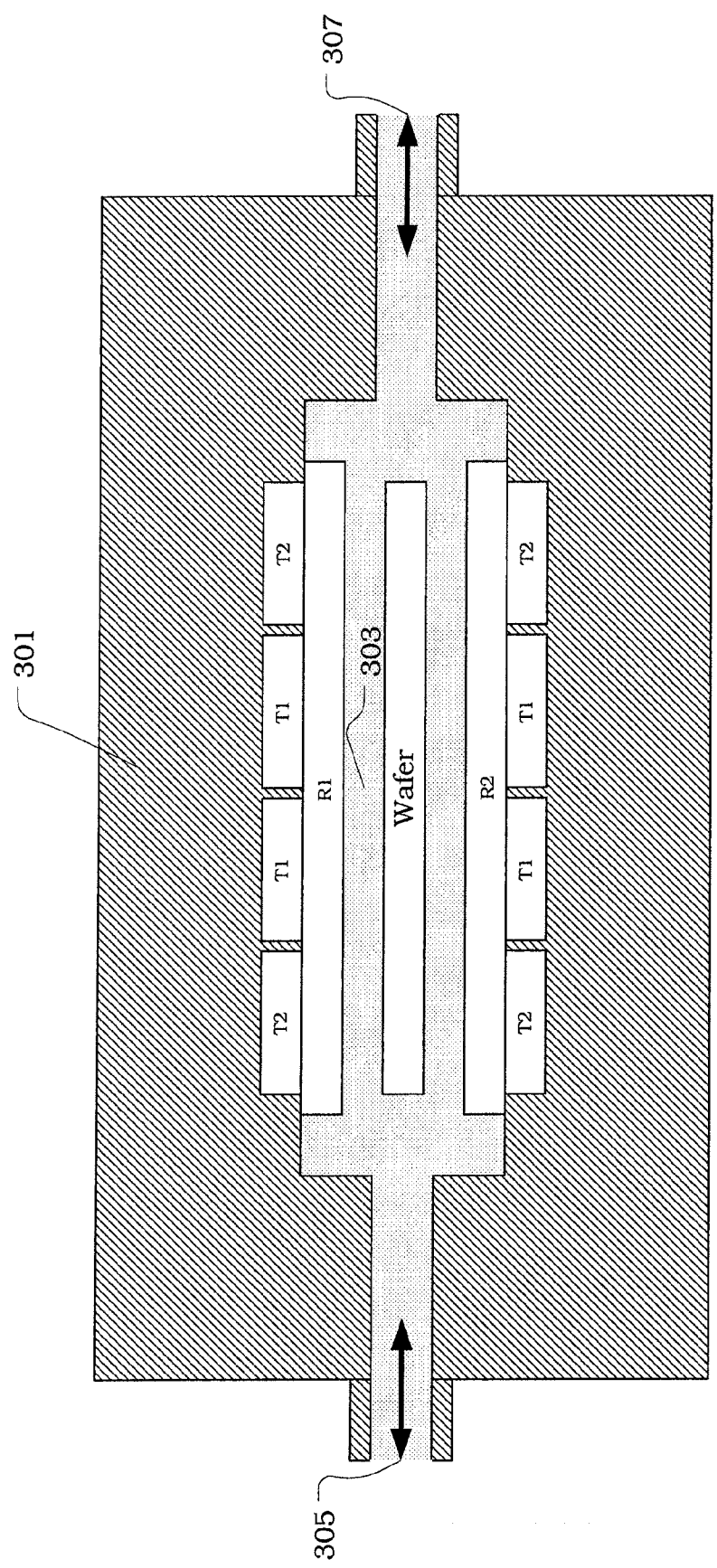
Figure 3C:
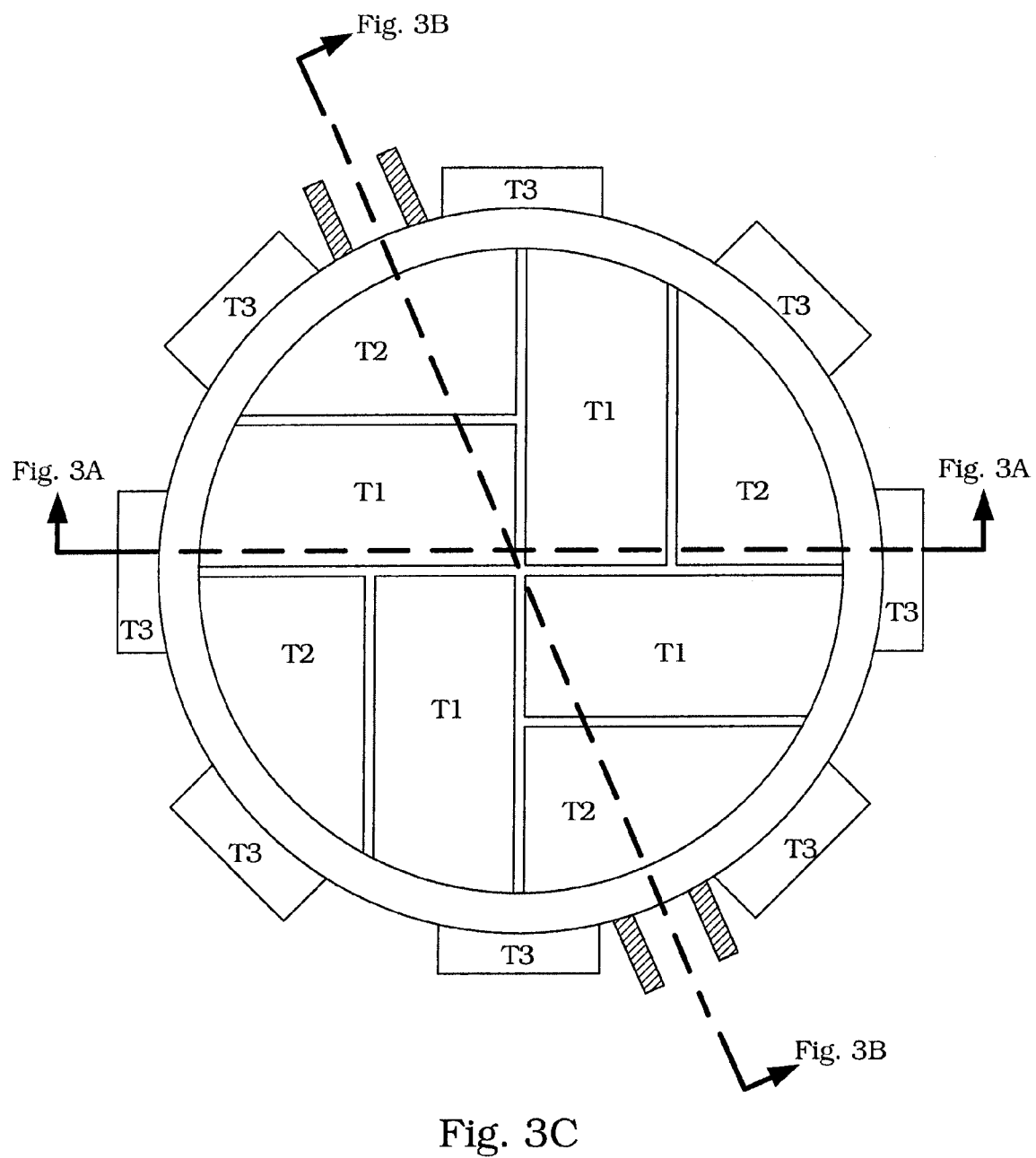

FIGS. 3A-3C are illustrations showing a chamber 301 for performing a wafer cleaning operation using high-frequency acoustic energy applied to a supercritical fluid, in accordance with one embodiment of the present invention. The chamber 301 cross-sections illustrated in FIGS. 3A and 3B are identified in FIG. 3C. The chamber 301 includes top, bottom, and side walls surrounding an internal volume 303. In one embodiment, the periphery of the chamber 301 is cylindrical with horizontal top and bottom members. However, in other embodiments the chamber 301 may have a polygonal peripheral shape such as rectangular, pentagonal, hexagonal, etc. Additionally, in other embodiments the chamber 301 top and bottom members may be hemispherical or polygonal in shape. Regardless of their specific shape, the chamber 301 walls are capable of maintaining a pressure within the internal volume 303 of up to about 200 atm. As used herein, the term "about" means within ±10% of a specified value. The chamber 301 is also equipped with temperature monitoring and control devices to maintain a necessary temperature within the internal volume 303 to ensure the integrity of a supercritical fluid state. With reference to FIG. 3B, the chamber 301 is configured with inlets and outlets through which the supercritical fluid is introduced and removed as indicated by arrows 305 and 307. In other embodiments the chamber 301 can be equipped with a number of inlets and outlets depending on the desired flow control to be applied to the supercritical fluid. Additionally, inlets and outlets can be configured radially and/or centrally, whereby fluids are injected from the periphery and exit through the top and/or bottom center of the chamber. Additionally, the fluids can be injected through the top and/or bottom center of the chamber, and exit from the periphery.

The internal volume 303 is also configured to receive a wafer for cleaning. In one embodiment, the supercritical fluid is applied to all surfaces of the wafer. In other embodiments, the supercritical fluid can be applied to specific surfaces of the wafer. For example, if the wafer is positioned to contact a support structure within the internal volume 303, the surfaces of the wafer in contact with the support structure may not be exposed to the supercritical fluid. In one embodiment, the internal volume 303 is sized such that the wafer, when disposed within the internal volume 303, will be surrounded by a supercritical fluid thickness up to about 0.5 inch on each side. In one embodiment, the supercritical fluid thickness can be different for each side of the wafer. Furthermore, in other embodiments, the supercritical fluid thickness can be greater than 0.5 inch for particular sides. In general, the internal volume 303 is sized to allow high-frequency acoustic energy to achieve optimal activation of the supercritical fluid at the wafer surface.

A number of transducers (T1, T2, and T3) are disposed around the internal volume 303. Transducers positioned at the top, bottom, and sides of the internal volume 303 are secured to resonators R1, R2, and R3 respectively. The transducers and resonators are configured to apply high-frequency acoustic energy to the supercritical fluid to be contained and maintained within the internal volume 303. The transducers can be composed of piezoelectric material such as piezoelectric ceramic, lead zirconium tintanate, piezoelectric quartz, or gallium phosphate, among others. The resonators are essentially plates that can be composed of ceramic, silicon carbide, stainless steel, aluminum, or quartz, among others.

The transducer configurations on the top and periphery of the chamber 301 are shown in FIG. 3C. The transducer configurations on the bottom of the chamber 301 match the transducer configurations on the top of the chamber 301 (i.e., the top and bottom transducers are mirrored with respect to each other). To facilitate impedance matching, each of the transducers T1 and T2 distributed across the top and bottom of the chamber 301 should have approximately the same surface area facing the chamber internal volume 303. Activation of the various transducers can be cycled or alternated such that only a portion of the transducers are on at a given time. The top and bottom transducers can be used to activate the supercritical fluid in a direction perpendicular to the wafer surface. The side transducers can be used to activate the supercritical fluid in a direction across the wafer surface. The transducers can also be attached to the resonator in a variety of ways. For example, the transducers can be attached flush to their respective resonator to be either horizontal, perpendicular, or angled to the wafer surface. Attachment of the transducers at an angle to the wafer surface can be used to improve acoustic energy stability by reducing impedance variation and harmonic interference caused by acoustic energy reflection from the wafer surface. In one embodiment, the transducers can be angled between about 2° and about 10° relative to a vector perpendicular to the wafer surface.

In the embodiment of FIGS. 3A-3C, the transducers on the top and bottom of the chamber are arranged in a single level, respectively. Thus, each of the transducers T1 and T2 must be separated by a gap to avoid physical contact and corresponding damage during activation. In one embodiment, the gap is about 1 mm. Since the acoustic energy generated by the transducers is transmitted in a substantially collimated manner toward the wafer surface, it is desirable to minimize the gap between adjacent transducers to obtain a corresponding minimization of wafer surface area to which acoustic energy is not applied. To eliminate effects of the gap (i.e., energy dead-zone), the wafer can be rotated so as to ensure all regions of the wafer are sufficiently covered. Rotating the wafer in a supercritical fluid process chamber is difficult and adds a significant amount of complexity and cost to the design. As an alternative to the single level transducer arrangement requiring the presence of gaps between adjacent transducers or a means of rotating the wafer, a multi-level transducer arrangement can be used to eliminate the need for gaps between adjacent transducers.

Figure 4A:
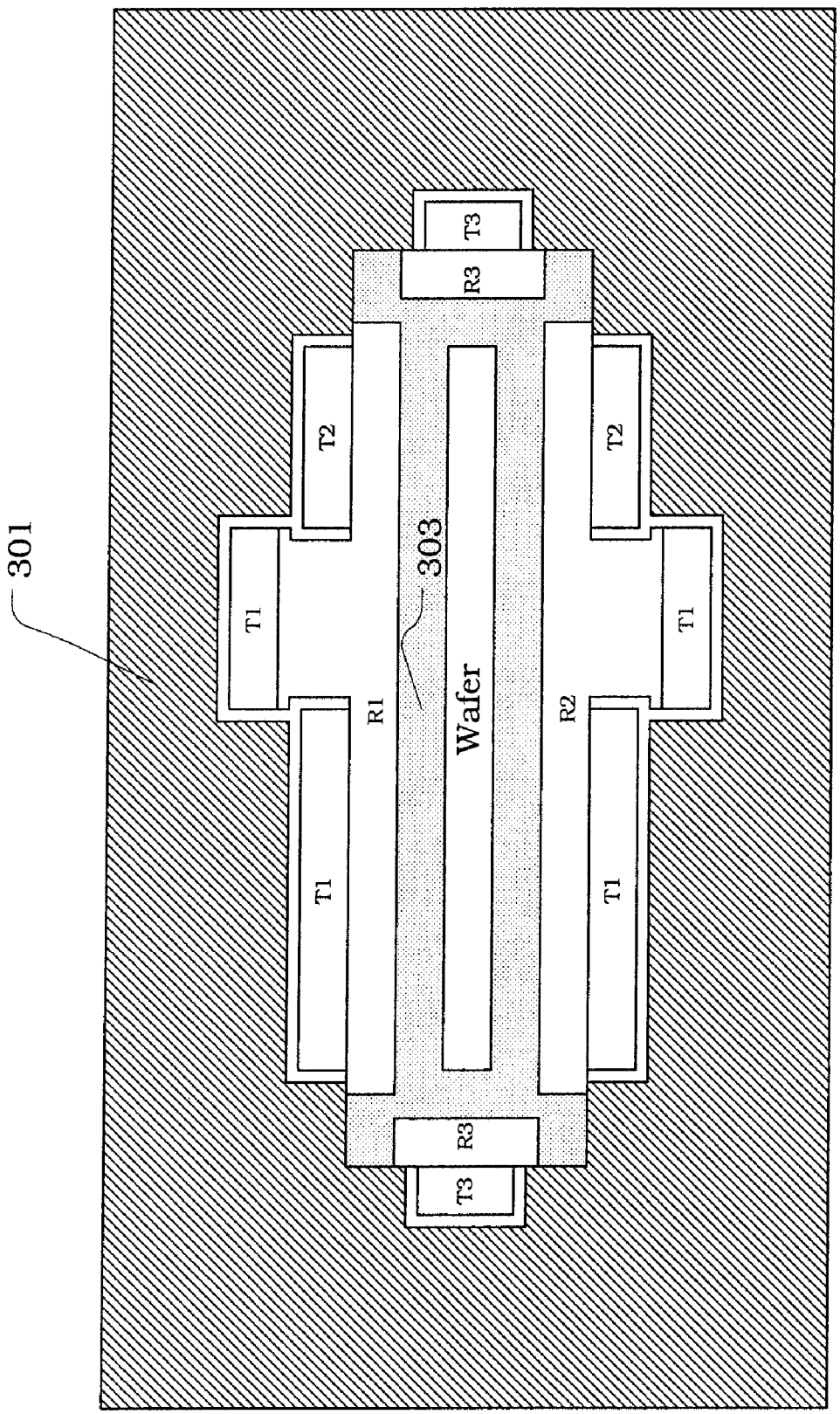
FIGS. 4A-4C are illustrations showing the chamber incorporating a multi-level transducer arrangement, in accordance with one embodiment of the present invention.
Figure 4B:
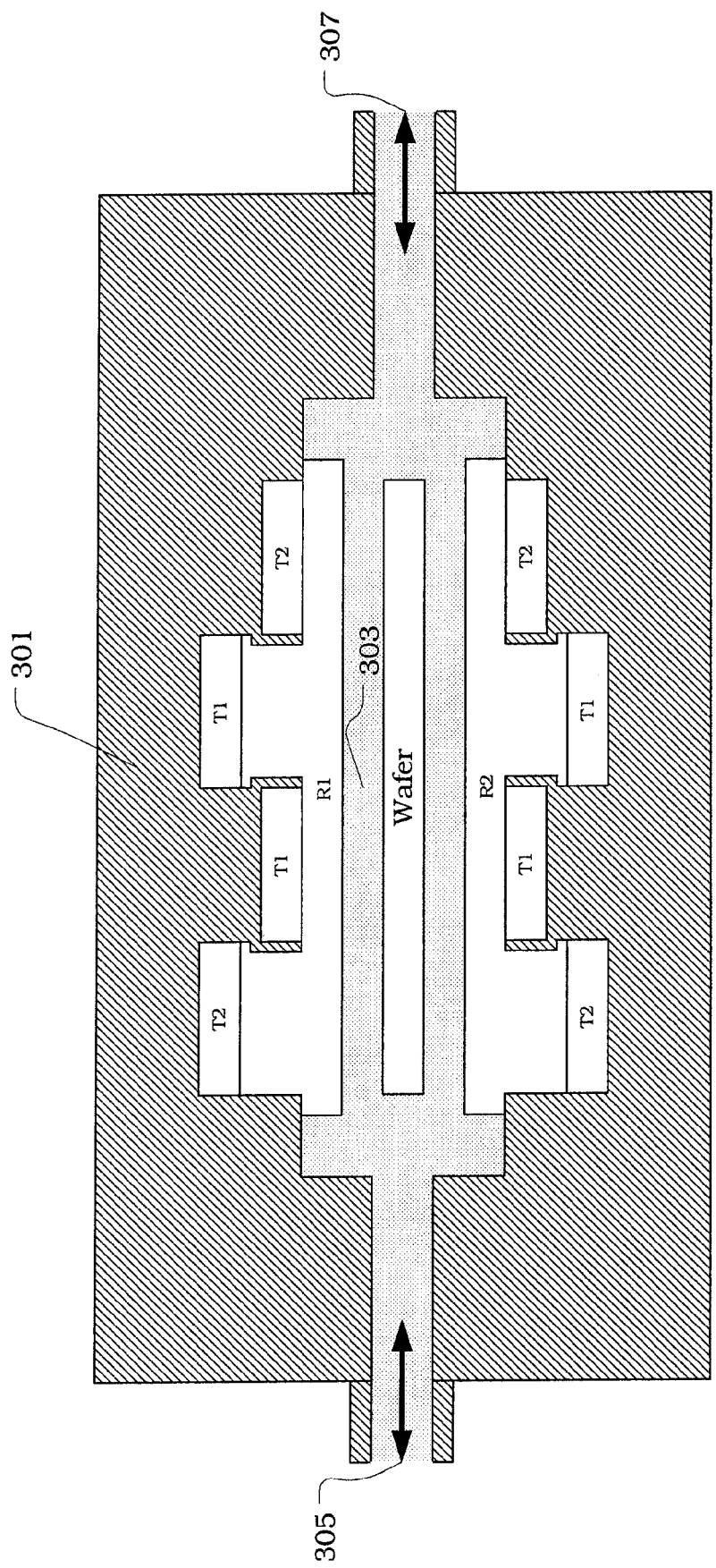
Figure 4C:
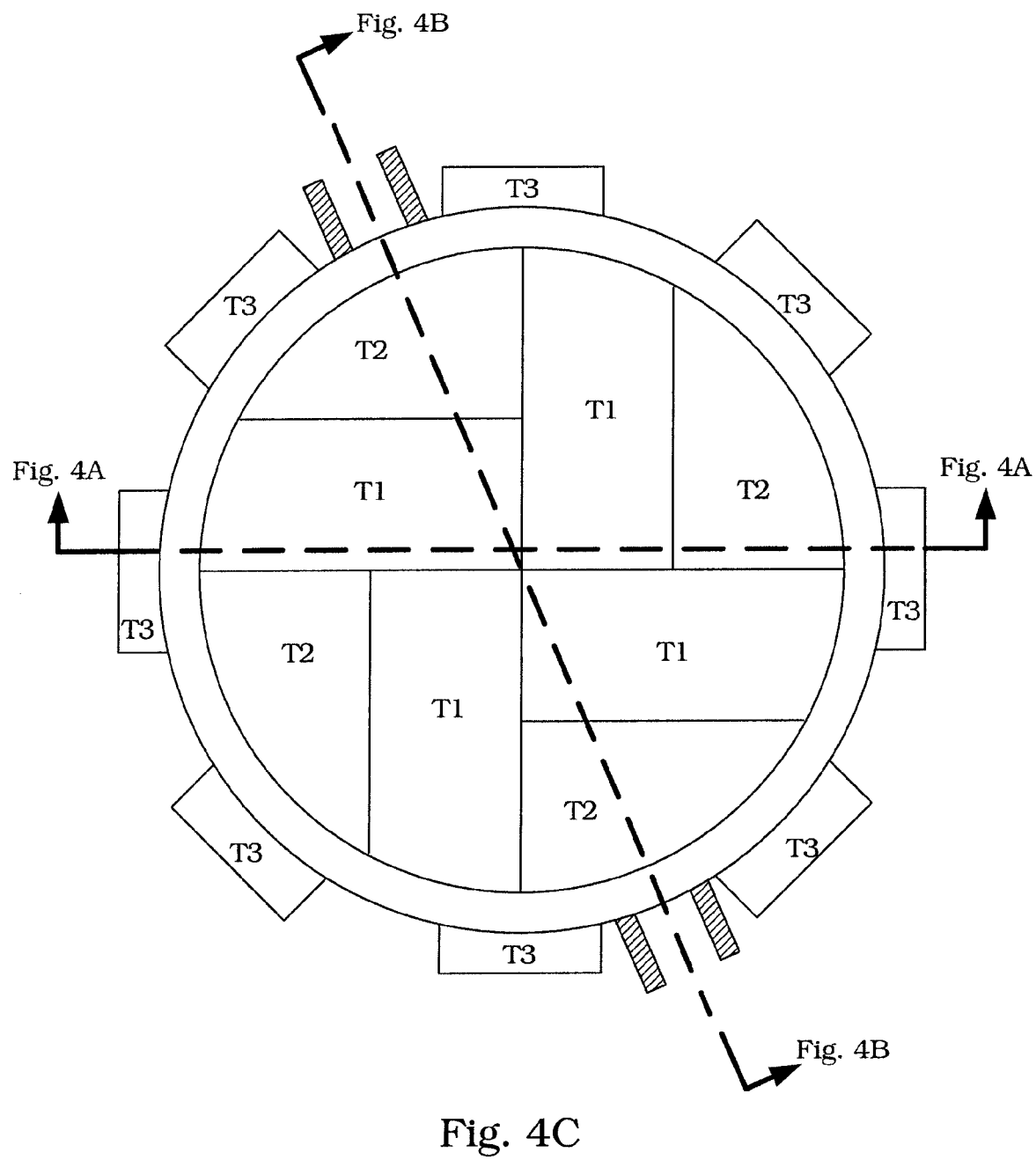

FIGS. 4A-4C are illustrations showing the chamber 301 incorporating a multi-level transducer arrangement, in accordance with one embodiment of the present invention. FIGS. 4A-4C are analogous to FIGS. 3A-3C, respectively, with the exception that the top and bottom transducers are arranged in multiple levels, respectively. By arranging the transducers T1 and T2 in multiple levels, the edge of a transducer on one level can be positioned equal with an edge of an adjacent transducer on another level. Therefore, gaps between adjacent transducers are not necessary and can be eliminated. Elimination of gaps between adjacent transducers allows acoustic energy to be applied to the entire wafer surface.

High-frequency acoustic energy imparted from the transducers through the resonators to the supercritical fluid causes acoustic streaming of the supercritical fluid which results in an enhancement of mass transport and increased physical interaction between the supercritical fluid and the wafer surface. Thus, the high-frequency acoustic energy imparted through the supercritical fluid is used to transfer energy to the particle-substrate interface and break the attractive forces between the particle and wafer surface, facilitating removal of the contamination from the wafer surface by the acoustic streaming phenomena. Therefore, rather than relying solely on shear force provided by the supercritical fluid linear velocity, the present invention provides for the use of high-frequency acoustic energy to mechanically dislodge particulate contamination from the wafer surface and aid removal by acoustic streaming. The high-frequency acoustic energy can be applied to both non-flowing and flowing supercritical fluid. Thus, by applying high-frequency acoustic energy to the supercritical fluid it is possible to enhance particle de-adhesion from the wafer surface, reduce shear force required to remove particles from the wafer surface, and reduce cleaning process cycle times.

Through the use of high-frequency acoustic energy as afforded by the present invention, the beneficial properties of supercritical fluid can be exploited in a practical and efficient wafer cleaning process. The near zero surface tension of supercritical fluid allows the supercritical fluid to get into small features on the wafer surface. Furthermore, the near zero surface tension of the supercritical fluid allows for its easy removal from high aspect ratio features on the wafer during the drying process, as the pressure can be lowered to convert the fluid from a supercritical phase to a gas phase. Additionally, the supercritical fluid has a diffusivity property similar to that of a gas. Therefore, the supercritical fluid can get into and out of porous regions of wafer materials, such as low-K dielectric material, with relative ease. The supercritical fluid also has a density comparable to that of a liquid. Hence, the supercritical fluid is capable of efficiently transmitting the high-frequency acoustic energy generated by the transducers. Furthermore, due to its relatively high density, a significant amount of supercritical fluid can be transported to the wafer in a given amount of time. Transport of the supercritical fluid to the wafer is important not only from a mechanical perspective, but also from a chemical reaction perspective.

The supercritical fluid can be used as a transport mechanism for smaller amounts of chemicals that can enhance reactivity or removal of certain target contaminants. For example, the supercritical fluid can incorporate additives such as co-solvents and co-chelating agents. Examples of co-solvents and co-chelating agents that are compatible with supercritical fluid include $TiCl_4$, $SF_6$, $BF_3$, $C_2F_6$, 1,1,1,5,5,5,-hexafluoro-2,4-pentanedione, bis(trifluoroethyldithiocarbamate), metholheptafluorobutyrichydroxamic acid, beta-diketonates including crown ethers, dithiocarbamates, amines, hydroxamic acids and organophosphates. Also, the supercritical fluid can incorporate surfactant additives to discourage re-deposition of removed particles back onto the wafer. In addition to accommodating additives, the supercritical fluid itself can be composed of either one material or a mixture of materials. Examples of materials that can be used for supercritical fluid include $CO_2$, $H_2O$, Ne, $N_2$, Ar, Xe, $SF_6$, $C_3H_8$, and $NH_3$, among others.

Figure 5:
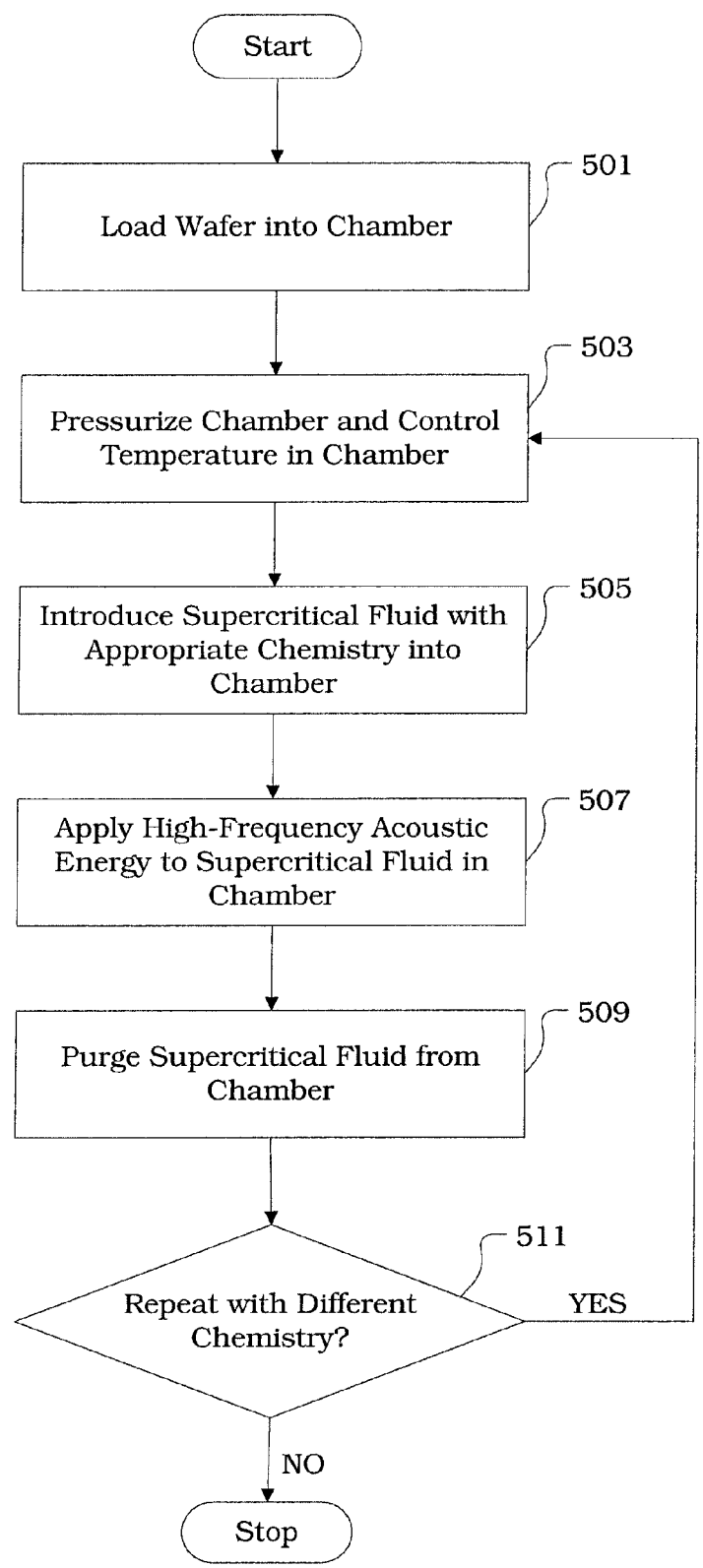
FIG. 5 is an illustration showing a flowchart of a method for using high-frequency acoustic energy with a supercritical fluid to perform a wafer cleaning process, in accordance with one embodiment of the present invention.

FIG. 5 is an illustration showing a flowchart of a method for using high-frequency acoustic energy with a supercritical fluid to perform a wafer cleaning process, in accordance with one embodiment of the present invention. The method begins with an operation 501 in which a wafer is loaded into a chamber. The chamber is configured to maintain a supercritical fluid state and apply high-frequency acoustic energy to the supercritical fluid. The method continues with an operation 503 in which the chamber is pressurized and the temperature within the chamber is controlled. The chamber pressure and temperature are controlled to maintain a supercritical fluid state. In an exemplary embodiment, the chamber can be pre-pressurized with $CO_2$ only or with a mixture of $CO_2$ and an appropriate chemistry. The critical pressure and temperature for $CO_2$ is approximately 73 atm and 31° C., respectively. It should be noted that the method of FIG. 5 is not restricted to using $CO_2$. Other suitable supercritical fluids can also be used.

In an operation 505, the supercritical fluid having an appropriate chemistry is introduced into the chamber. The supercritical fluid can be introduced to only fill the chamber volume or to fill and provide a continuous flow through the chamber volume. The chemistry of the supercritical fluid may include additives such as co-solvents, co-chelating agents, surfactants, or any combination thereof. The additives contained within the supercritical fluid can be useful for performing specific functions, such as dissolving and removing photoresist, dissolving and removing organic residue, and chelating metals, among others.

The method continues with an operation 507 in which high-frequency acoustic energy is applied to the supercritical fluid contained within the chamber. The high-frequency acoustic energy is applied to the wafer for an amount of time sufficient to obtain adequate cleaning results. In one embodiment, the high-frequency acoustic energy application time for a single wafer can be within a range extending from about 5 seconds to about 120 seconds. In another embodiment, the high-frequency acoustic energy application time for a single wafer can be within a range extending from about 15 seconds to about 60 seconds, with an average application time of about 30 seconds. In a preferred embodiment, the high-frequency energy application time is minimized to optimize wafer throughput. In one embodiment, the high-frequency acoustic energy can be applied with a frequency within a range extending from about 200 kHz to about 50 MHz. In another embodiment, the high-frequency acoustic energy can be applied with a frequency within a range extending from about 500 kHz to about 2 MHz. The high-frequency acoustic energy can also be applied directionally to the supercritical fluid and ultimately the wafer by activating certain combinations of transducers at a given time. For example, the top and bottom transducers can be used to activate the supercritical fluid in a direction perpendicular to the wafer surface. Alternatively, the side transducers can be used to activate the supercritical fluid across the wafer surface. Also, the high-frequency acoustic energy can be applied from different combinations of transducers on a cyclic basis.

After application of the high-frequency acoustic energy, the method continues with an operation 509 in which the supercritical fluid is purged from the chamber. The supercritical fluid purge generally includes de-pressurization and flushing of the chamber. In one embodiment, a $CO_2$ only rinse may be performed as part of operation 509 prior to depressurization of the chamber. The $CO_2$ only rinse can be used to ensure that chemical additives and removed contaminants are no longer present in the chamber.

The method then proceeds to a decision operation 511 in which a determination is made to either repeat the cleaning process using a different supercritical fluid chemistry or terminate the cleaning process. In some wafer cleaning operations, different types of contaminants may require the use of a specialized chemistry. Thus, the option to repeat the cleaning process using a different supercritical fluid chemistry provides for sequential targeting of particular types of contaminants. For example, in one pass through operations 503-509 a supercritical fluid containing co-solvent A may be used to remove particle X. Then in a subsequent pass through operations 503-509 a supercritical fluid containing co-solvent B may be used to remove particle Y, etc. Use of specialized supercritical fluid chemistries in sequential passes through operations 503-509 can be used to dissolve particular materials, chelate particular materials, and prevent re-deposition of particular materials. It is therefore apparent that the method of FIG. 5 offers significant flexibility in defining a wafer cleaning process that is tailored for a particular wafer condition.

Application of high-frequency acoustic energy as provided by the present invention allows the beneficial properties of supercritical fluid to be exploited in a highly practical and efficient wafer cleaning process. By applying high-frequency acoustic energy to the supercritical fluid, the unreasonable reliance on high linear velocities of the supercritical fluid to mechanically dislodge particulates from the wafer surface is eliminated. The high-frequency acoustic energy applied to the supercritical fluid is transferred to the particles such that the strong intermolecular forces binding the particles to the wafer are overcome. With the present invention the supercritical fluid properties of near zero surface tension, high diffusivity, high density, and chemical mixing capability can be used to efficiently and effectively perform a wafer cleaning process.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for cleaning a wafer, comprising:
disposing a wafer between a first plurality of transducers and a second plurality of transducers such that the first plurality of transducers are positioned above a top surface of the wafer and such that the second plurality of transducers are positioned below a bottom surface of the wafer,
wherein the first plurality of transducers positioned above the top surface of the wafer includes transducers of different shape that each have a same surface area size facing the top surface of the wafer, and
wherein the second plurality of transducers positioned below the bottom surface of the wafer mirrors the first plurality of transducers positioned above the top surface of the wafer with regard to a shape and a size of each transducer, such that each transducer in both the first and second pluralities of transducers is defined to have approximately a same surface area size facing the wafer;
exposing the wafer to a supercritical fluid; and
operating the first and second plurality of transducers to generate and transfer acoustic energy through the supercritical fluid to the wafer.

2. A method for cleaning a wafer as recited in claim 1, wherein the wafer is disposed such that a top surface of the wafer is substantially parallel to a surface of each of the first plurality of transducers, and a bottom surface of the wafer is substantially parallel to a surface of each of the second plurality of transducers.

3. A method for cleaning a wafer as recited in claim 1, further comprising:
maintaining a temperature within the chamber at or above a critical temperature of the supercritical fluid; and
maintaining a pressure within the chamber at or above the critical pressure of the supercritical fluid.

4. A method for cleaning a wafer as recited in claim 1, further comprising:
flowing the supercritical fluid over a top surface of the wafer.

5. A method for cleaning a wafer as recited in claim 1, wherein the first and second plurality of transducers are operated to generate acoustic energy having a frequency within a range extending from about 200 kHz to about 50 MHz.

6. A method for cleaning a wafer as recited in claim 1, wherein the acoustic energy is generated for a duration extending from about 5 seconds to about 120 seconds.

7. A method for cleaning a wafer as recited in claim 1, wherein the supercritical fluid includes one or more of a co-solvent, a co-chelating agent, and a surfactant.

8. A method for cleaning a wafer, comprising:
disposing a wafer between a first plurality of transducers and a second plurality of transducers such that the first plurality of transducers are positioned above a top surface of the wafer and such that the second plurality of transducers are positioned below a bottom surface of the wafer,
wherein the second plurality of transducers mirrors the first plurality of transducers with regard to a geometric configuration of each transducer, and
wherein the first plurality of transducers is defined in multiple vertically separated levels such that adjacent transducers within the first plurality of transducers are disposed in different ones of the multiple vertically separated levels so as to avoid gaps between adjacent transducers within the first plurality of transducers;
exposing the wafer to a supercritical fluid; and
activating a pair of mirrored transducers defined by one transducer in the first plurality of transducers and one transducer in the second plurality of transducers so as to generate and transfer acoustic energy through the supercritical fluid to the wafer in a direction extending between the pair of mirrored transducers.

9. A method for cleaning a wafer as recited in claim 8, wherein the direction extending between the pair of mirrored transducers is substantially perpendicular to a top surface of the wafer.

10. A method for cleaning a wafer as recited in claim 8, wherein the wafer is disposed such that a top surface of the wafer is substantially parallel to a surface of each of the first plurality of transducers, and a bottom surface of the wafer is substantially parallel to a surface of each of the second plurality of transducers.

11. A method for cleaning a wafer as recited in claim 8, wherein activating the pair of mirrored transducers is performed in a cyclical manner such that different pairs of mirrored transducers in the first and second pluralities of transducers are activated at respectively different times.

12. A method for cleaning a wafer as recited in claim 8, further comprising:
activating one or more transducers around a periphery of the wafer to generate and transfer acoustic energy through the supercritical fluid in a direction substantially parallel to a top surface of the wafer and in proximity to the top surface of the wafer.

13. A method for cleaning a wafer as recited in claim 8, further comprising:
exposing the wafer to a clean supercritical fluid rinse, the clean supercritical fluid rinse comprising supercritical fluid without additives.

14. A method for cleaning a wafer as recited in claim 13, further comprising:
exposing the wafer to a second supercritical fluid, wherein the second supercritical fluid has a different chemistry than a previous supercritical fluid; and
applying acoustic energy to the second supercritical fluid.

15. A method for cleaning a wafer, comprising:
disposing a wafer between a first plurality of transducers and a second plurality of transducers such that the first plurality of transducers are positioned above a top surface of the wafer and such that the second plurality of transducers are positioned below a bottom surface of the wafer,
wherein each of the first plurality of transducers is mirrored by a transducer in the second plurality of transducers to form a mirrored pair of transducers,
wherein each transducer in both the first and second pluralities of transducers is defined to have a same surface area size facing the wafer,
wherein the first plurality of transducers is defined in multiple vertically separated levels above the top surface of the wafer such that adjacent transducers within the first plurality of transducers are disposed in different ones of the multiple vertically separated levels above the top surface of the wafer so as to avoid gaps between adjacent transducers within the first plurality of transducers, and
wherein the second plurality of transducers is defined in multiple vertically separated levels below the bottom surface of the wafer such that adjacent transducers within the second plurality of transducers are disposed in different ones of the multiple vertically separated levels below the bottom surface of the wafer so as to avoid gaps between adjacent transducers within the second plurality of transducers;
exposing the wafer to a supercritical fluid; and
cyclically activating each mirrored pair of transducers so as to transfer acoustic energy through the supercritical fluid to different areas the wafer, wherein each of the different areas of the wafer corresponds to activation of a different mirrored pair of transducers.

16. A method for cleaning a wafer as recited in claim 15, wherein the cyclically activating is performed to ensure that an entirety of a top surface of the wafer is subjected to acoustic energy.

17. A method for cleaning a wafer as recited in claim 15, wherein the wafer is disposed such that a top surface of the wafer is substantially parallel to a surface of each of the first plurality of transducers, and a bottom surface of the wafer is substantially parallel to a surface of each of the second plurality of transducers.

18. A method for cleaning a wafer as recited in claim 15, further comprising:
activating one or more transducers around a periphery of the wafer to generate and transfer acoustic energy through the supercritical fluid in a direction substantially parallel to a top surface of the wafer and in proximity to the top surface of the wafer.

19. A method for cleaning a wafer as recited in claim 18, wherein activation of one or more transducers around the periphery of the wafer is performed between cyclic activation of each mirrored pair of transducers.

20. A method for cleaning a wafer as recited in claim 18, wherein activation of one or more transducers around the periphery of the wafer is performed simultaneously with activation of each mirrored pair of transducers.

* * * * *